(12) United States Patent
Chuang

(10) Patent No.: US 12,212,226 B2
(45) Date of Patent: Jan. 28, 2025

(54) CONVERSION CIRCUIT

(71) Applicant: Ancora Semiconductors Inc., Taoyuan (TW)

(72) Inventor: Po-Chin Chuang, Taoyuan (TW)

(73) Assignee: Ancora Semiconductors Inc., Taoyuan (TW)

( * ) Notice: Subject to any disclaimer, the term of this patent is extended or adjusted under 35 U.S.C. 154(b) by 291 days.

(21) Appl. No.: 17/809,011

(22) Filed: Jun. 27, 2022

(65) Prior Publication Data

US 2022/0416645 A1    Dec. 29, 2022

Related U.S. Application Data

(60) Provisional application No. 63/215,978, filed on Jun. 28, 2021.

(51) Int. Cl.
*H02M 1/08* (2006.01)
*H02M 7/537* (2006.01)

(52) U.S. Cl.
CPC ............. *H02M 1/08* (2013.01); *H02M 7/537* (2013.01)

(58) Field of Classification Search
CPC ........... H02M 1/08; H02M 7/53; H02M 7/537
See application file for complete search history.

(56) References Cited

U.S. PATENT DOCUMENTS

| | | | |
|---|---|---|---|
| 9,954,430 B2 | 4/2018 | Horváth et al. | |
| 10,075,063 B2 | 9/2018 | Peng et al. | |
| 10,756,616 B2 | 8/2020 | Eggermont et al. | |
| 10,826,484 B2 * | 11/2020 | Hu | H03K 17/04106 |
| 10,924,105 B2 * | 2/2021 | Hu | H03K 5/08 |
| 11,489,521 B2 * | 11/2022 | Yen | H03K 17/567 |
| 2005/0226012 A1 | 10/2005 | Jovanovic et al. | |
| 2011/0032732 A1 | 2/2011 | Hsu | |
| 2011/0285447 A1 * | 11/2011 | Nakanishi | H03K 17/6871 327/326 |
| 2015/0171852 A1 | 6/2015 | Pang | |
| 2019/0273491 A1 * | 9/2019 | Hu | H03K 17/04106 |
| 2021/0258008 A1 * | 8/2021 | Arisawa | H03K 17/08122 |

FOREIGN PATENT DOCUMENTS

| | | |
|---|---|---|
| CN | 108306496 A | 7/2018 |
| CN | 108322053 A | 7/2018 |
| CN | 112769422 A | 5/2021 |
| JP | 2019004640 A | 1/2019 |
| TW | 201419722 A | 5/2014 |
| TW | I487283 B | 6/2015 |

\* cited by examiner

*Primary Examiner* — Adolf D Berhane
(74) *Attorney, Agent, or Firm* — CKC & Partners Co., LLC

(57) ABSTRACT

A conversion circuit includes a voltage supply circuit, a storage circuit, and a gate terminal. The storage circuit includes a first terminal and a source terminal. The voltage supply circuit is configured to provide a bias voltage according to a power supply voltage. The first terminal is configured to receive a low voltage. The source terminal is configured to output a source voltage according to a storage voltage and the low voltage, wherein the storage circuit is configured to storage the storage voltage according to the bias voltage and the low voltage. The gate terminal is configured to output a gate voltage, wherein during a first period, the gate terminal is coupled to the first terminal, and the gate-source voltage can form a negative voltage.

23 Claims, 16 Drawing Sheets

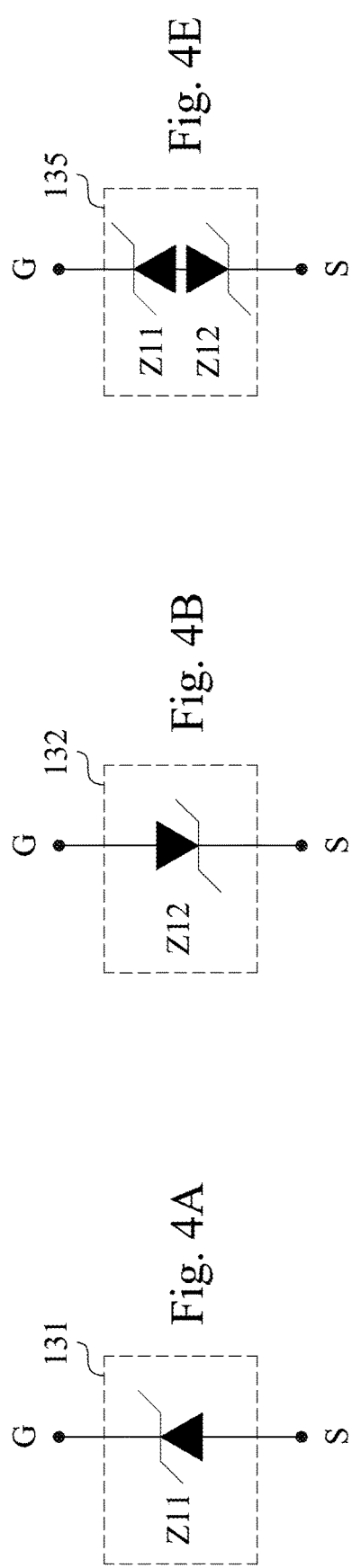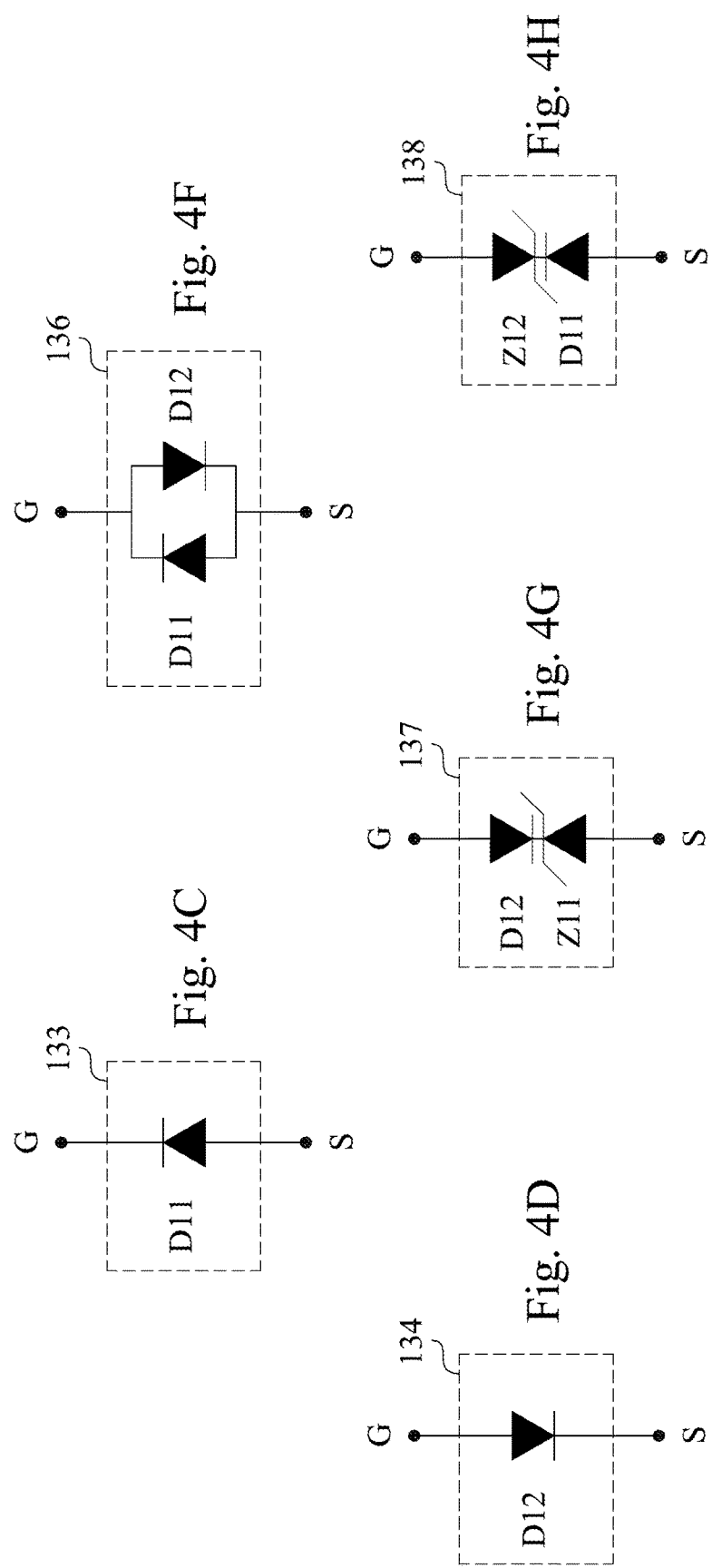

CONVERSION CIRCUIT

CROSS-REFERENCE TO RELATED APPLICATION

This application claims priority to U.S. Provisional Application Ser. No. 63/215,978, filed Jun. 28, 2021, which is herein incorporated by reference in its entirety.

BACKGROUND

Field of Invention

The present invention relates to a conversion circuit. More particularly, the present disclosure relates to a conversion circuit used to control a main device on or off.

Description of Related Art

Currently, a Power Semiconductor Switching Device (hereafter referred to simply as a switching device) can be turned on or off by applying a positive or negative voltage to the gate of the switching device. However, general switching device driving circuits can not produce the negative voltage to turn-off switching device before operating, so there is a false turn-on issue often occur in the initial start-up state.

SUMMARY

The present disclosure provides a conversion circuit comprises a voltage supply circuit, a storage circuit, and a gate terminal. The storage circuit comprises a first terminal and a source terminal. The voltage supply circuit is configured to provide a bias voltage according to a power supply voltage. The first terminal is configured to receive a low voltage. The source terminal is configured to output a source voltage according to a storage voltage and the low voltage, wherein the storage circuit is configured to storage the storage voltage according to the bias voltage and the low voltage. The gate terminal is configured to output a gate voltage, wherein a gate-source voltage is a voltage across the gate terminal and the source terminal, wherein during a first period, the gate terminal is coupled to the first terminal, and the gate-source voltage comprises a negative voltage.

Therefore, according to the technical content of the present disclosure, the conversion circuit of the present disclosure can output a negative voltage at an initial stage, and adjust the voltage range through the voltage clamp circuit, so as to achieve the gate-source voltage control of the main device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as below.

FIG. 4A~4H are schematic diagrams of a plurality of elements of a voltage clamp circuit according to some embodiments of the present disclosure.

DETAILED DESCRIPTION

Figure 1:
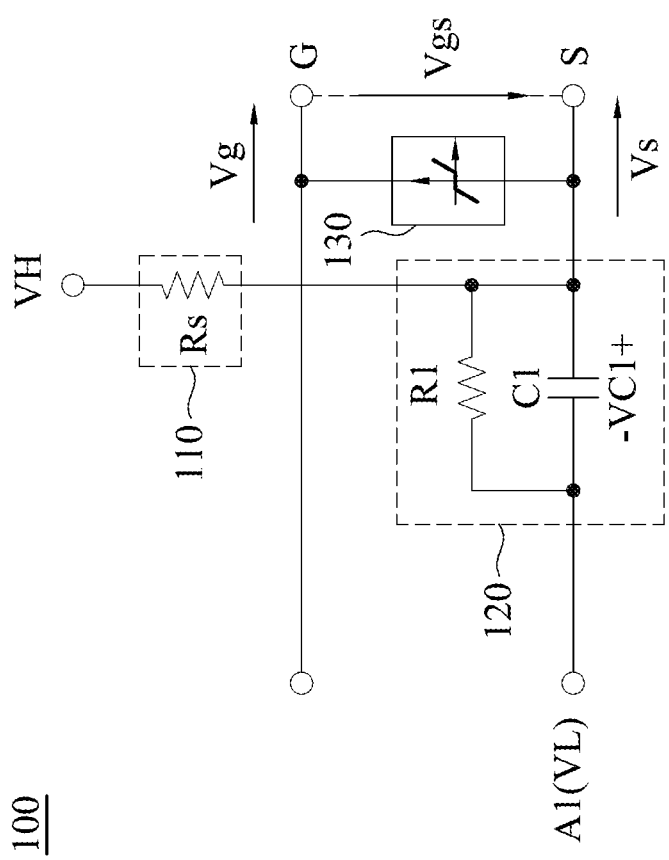
FIG. 1 is a block diagram of a conversion circuit according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a block diagram of a conversion circuit according to one embodiment of the present disclosure. As shown in the figure, the conversion circuit 100 includes a voltage supply circuit 110, a storage circuit 120, and a gate terminal G. The storage circuit 120 includes a first terminal A1 and a source terminal S.

In order to provide a conversion circuit technology that outputs a negative voltage at an initial stage and adjusts a voltage range through a voltage clamp circuit, so as to achieve a gate-source voltage control of a main device, the present disclosure provides the conversion circuit 100 as shown in FIG. 1, and the related operations are described in detail as below.

Figure 2:
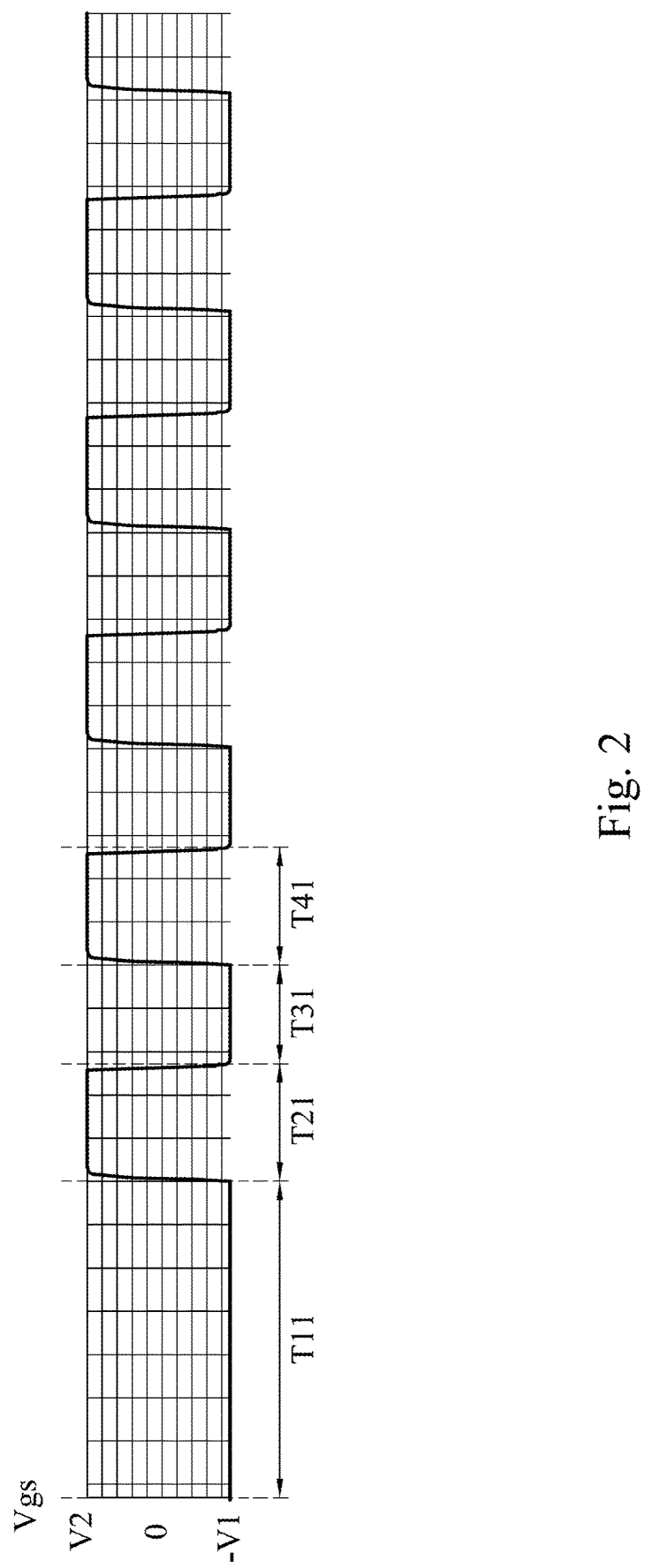
FIG. 2 is a schematic diagram of a waveform of a voltage across a gate terminal and a source terminal of a storage circuit according to one embodiment of the present disclosure.

FIG. 2 is a schematic diagram of a waveform of a voltage across a gate terminal and a source terminal of the storage circuit according to one embodiment of the present disclosure. Please refer to FIG. 1 and FIG. 2, in one embodiment, the voltage supply circuit 110 is configured to provide a bias voltage according to a power supply voltage VH. For example, the voltage supply circuit 110 can be a voltage supply resistor Rs, the power supply voltage VH can be a high voltage which comes from a power supply device (not shown), and the bias voltage can be generated according to the voltage supply resistor Rs and the power supply voltage VH, but the present disclosure is not limited to this embodiment. In some embodiments, the power supply voltage VH can be the high voltage which comes from a power supply device (not shown), and the high voltage can be greater than the low voltage VL.

The first terminal A1 is configured to receive a low voltage VL. The source terminal S is configured to output a source voltage Vs according to a storage voltage and the low voltage VL, and the storage circuit 120 is configured to storage the storage voltage according to the bias voltage and the low voltage VL. For example, the source terminal S can be coupled to a source terminal of a main device (not shown), and the low voltage VL can be 0 (e.g., grounded) or a negative voltage. The storage circuit 120 includes a storage resistor R1 and a storage capacitor C1. In view of the above, the storage voltage can be VC1 which is generated according to the voltage supply resistor Rs, the power supply voltage VH, and the storage resistor R1, but the present disclosure is not limited to this embodiment. In some embodiments, the low voltage VL can be a positive voltage which is smaller than the power supply voltage VH. In some embodiments, the low voltage VL can be a low voltage level which smaller than supply voltage VH, but the present disclosure is not limited to this embodiment.

In some embodiments, the storage resistor R1 can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

In some embodiments, the storage capacitor C1 can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

In some embodiments, the voltage supply resistor Rs can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

Please refer to FIG. 1 and FIG. 2, the gate terminal G is configured to output a gate voltage Vg, and a gate-source voltage Vgs is a voltage across the gate terminal G and the source terminal S. During a first period T11, the gate terminal G is coupled to the first terminal A1, and the gate-source voltage Vgs can form a negative voltage. For example, the gate terminal G can be coupled to a gate terminal of a main device (now shown), the gate voltage Vg outputted by the gate terminal G can come from the low voltage VL, the source voltage Vs outputted by the source terminal S can come from the storage voltage VC1, and the gate-source voltage Vgs can be a voltage across the gate terminal G and the source terminal S of the storage circuit 120. The gate-source voltage Vgs can be −V1 (shown in FIG. 2), and −V1 can be −VC1 when the low voltage VL is 0. In some embodiments, the gate-source voltage Vgs can be −4V or lower negative voltage level, but the present disclosure is not limited to this embodiment.

In addition, there will be noise from the main device or the external environment and the noise will interfere with the conversion circuit 100. Even if the gate voltage Vg from the gate terminal G has the above-mentioned noise, the conversion circuit 100 is capable of providing the gate voltage Vg being negative so as to neutralize the above-mentioned noise. For example, a value of the gate voltage being negative (e.g., −4V) is set to be larger than a value of the noise being positive (e.g., 1V); and therefore, the gate voltage Vg being negative (e.g., −4V) is able to neutralize the noise being positive (e.g., 1V), such that the gate voltage Vg will be always in a negative way. Subsequently, when the gate terminal of the main device (not shown) receives the gate voltage Vg being negative, the main device (not shown) can be turned on or turn off precisely, such that the effect of the false start caused by the noise signal is prevented. That is, as long as the sum of the voltages received by the gate to source terminal of the main device (now shown) is negative, the main device will not be accidentally turned on or turn off due to the influence of the noise.

In one embodiment, during a second period T21, the gate terminal G receives the power supply voltage VH, and the gate-source voltage Vgs can form a positive voltage. For example, the gate voltage Vg can be the power supply voltage VH, the source voltage Vs can be the storage voltage VC1 when the low voltage VL is 0. The gate-source voltage Vgs can be the power supply voltage VH minus the storage voltage VC1, and the gate-source voltage Vgs can be V2 (shown in FIG. 2). In some embodiments, the gate-source voltage Vgs can be 5V or higher positive voltage level, but the present disclosure is not limited to this embodiment.

In one embodiment, during a third period T31, the gate terminal G is coupled to the first terminal A1, and the gate-source voltage Vgs can form the negative voltage (e.g. −4V or lower negative voltage level). Subsequently, during a fourth period T41, the gate terminal G receives the power supply voltage VH, and the gate-source voltage Vgs can form the positive voltage (e.g., 5V or higher positive voltage level).

Figure 3:
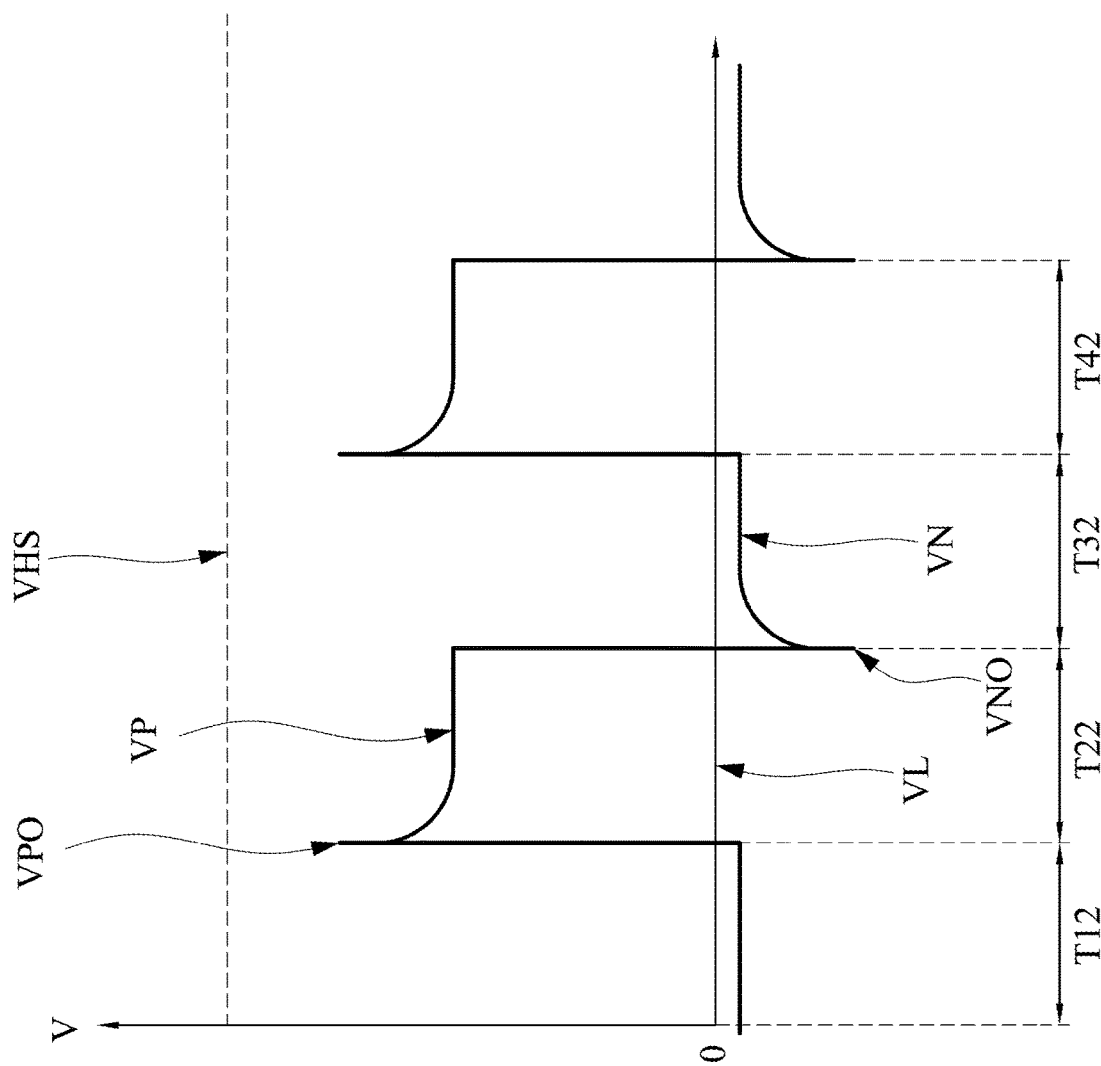
FIG. 3 is a schematic diagram of a waveform of a voltage across a gate terminal and a source terminal according to one embodiment of the present disclosure.

FIG. 3 is a schematic diagram of a waveform of a voltage across a gate terminal and a source terminal according to one embodiment of the present disclosure. Please refer to FIG. 1 and FIG. 3, in one embodiment, the gate terminal G is configured to output the gate voltage Vg, and the gate-source voltage Vgs is the voltage across the gate terminal and the source terminal. During a first period T12, the gate terminal G is coupled to the first terminal A1, and the gate-source voltage Vgs can form the negative voltage. For example, the gate-source voltage Vgs can be the voltage V across the gate terminal G and the source terminal S of the storage circuit 120. In some embodiments, a high voltage VHS can be a positive voltage or the power supply voltage VH, and the gate-source voltage Vgs is smaller than the power supply voltage VH, but the present disclosure is not limited to this embodiment.

In some embodiments, the threshold voltage of the GaN transistors is smaller than that of general transistors. In order to prevent the problem of turn-on failure of the GaN transistor, the best design is to use the voltage with 0V or the negative voltage which is less 0V to turn off the GaN transistor. During the first period T12, the gate terminal G is coupled to the first terminal A1 of the storage circuit 120, and the gate-source voltage Vgs can form the negative voltage. The conversion circuit 100 can provide the gate-source voltage Vgs to successfully turn off of GaN transistor, but the present disclosure is not limited to this embodiment.

In one embodiment, during a second period T22, the gate terminal G receives the power supply voltage VH, and the gate-source voltage Vgs can form the positive voltage. For example, the gate-source voltage Vgs can be an overcharge positive voltage VPO. Subsequently, the overcharge positive voltage VPO decreases to a stable voltage VP, and the gate-source voltage Vgs is accordingly reduced to the stable voltage VP, but the present disclosure is not limited to this embodiment.

In one embodiment, during a third period T32, the gate terminal G is coupled to the first terminal A1, and the gate-source voltage Vgs can form the negative voltage. For example, the gate-source voltage Vgs can be an overcharge negative voltage VNO. Subsequently, the overcharge negative voltage VNO increases to a stable voltage VN, and the gate-source voltage Vgs is accordingly raised to the stable voltage VN, but the present disclosure is not limited to this embodiment.

In one embodiment, during a fourth period T42, the gate terminal G receives the power supply voltage VH, and the gate-source voltage Vgs can form the positive voltage. For example, the gate-source voltage Vgs can be the overcharge positive voltage VPO. Subsequently, the overcharge positive voltage VPO decreases to a stable voltage VP, and the gate-source voltage Vgs is accordingly reduced to the stable voltage VP, but the present disclosure is not limited to this embodiment.

In some embodiments, for solving problems described above, the present disclosure provide a new switching device driving circuit that can produce the negative voltage to turn-off switching device before initial start-up state. Because of the invention can produce the negative voltage in the initial state, therefore it is suitable for driving normally on switching device and normally off switching device.

FIGS. 4A~4H are schematic diagrams of a plurality of elements of a voltage clamp circuit according to some embodiments of the present disclosure. Please refer to FIG. 1 first, in one embodiment, the conversion circuit 100 further includes a voltage clamp circuit 130. The voltage clamp circuit 130 is coupled between the gate terminal G and the source terminal S, and the voltage clamp circuit 130 is configured to clamp the gate-source voltage Vgs. In some embodiments, the voltage clamp circuit 130 shown in FIG. 1 can be implemented by different types of the voltage clamp circuits 131~138 as illustrated in FIGS. 4A~4H, which will be described below.

In one embodiment, the voltage clamp circuit 130 includes at least one of a first type diode and a second type diode. For example, the voltage clamp circuit 130 includes the first type diode, the second type diode, or the first type diode and the second type diode, the first type diode can be a normal diode, and the second type diode can be a Zener diode, but the present disclosure is not limited to this embodiment. In addition, the voltage clamp circuit 130 is configured to adjust a gate-source voltage range of the conversion circuit 100. In some embodiments, the voltage clamp circuit 130 can include at least one of the first type diode and a second type zener diode, the first type diode can be the normal diode, and the second type zener diode can be the Zener diode, but the present disclosure is not limited to this embodiment.

In some embodiments, the voltage clamp circuit 130 can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

Please refer to FIG. 1 and FIG. 4A, in one embodiment, the voltage clamp circuit 131 includes a first Zener diode Z11. For example, when a current flows through the first Zener diode Z11 from the gate terminal G to the source terminal S, a voltage across the first Zener diode Z11 is defined as a first reverse breakdown voltage VZ11, Otherwise, when a current flows through the first Zener diode Z11 from the source terminal S to the gate terminal G, a voltage across the first Zener diode Z11 is defined as a first forward voltage VFZ11, but the present disclosure is not limited to this embodiment.

Please refer to FIG. 1 and FIG. 4B, in one embodiment, the voltage clamp circuit 132 includes a second Zener diode Z12. For example, when a current flows through the second Zener diode Z12 from the gate terminal G to the source terminal S, a voltage across the second Zener diode Z12 is defined as a second forward voltage VFZ12, Otherwise, when a current flows through the second Zener diode Z12 from the source terminal S to the gate terminal G, a voltage across the second Zener diode Z12 is defined as the second reverse breakdown voltage VZ12, but the present disclosure is not limited to this embodiment.

Please refer to FIG. 1 and FIG. 4C, in one embodiment, the voltage clamp circuit 133 includes a first diode D11. For example, when a current flows through the first diode D11 from the source terminal S to the gate terminal G, a voltage across the first diode D11 is defined as a third forward voltage VFD11, but the present disclosure is not limited to this embodiment.

In addition, the voltage clamp circuit 133 further includes a plurality of first diodes D11. For example, the plurality of first diodes D11 can be coupled in series to increase a clamp voltage across the gate terminal G and the source terminal S, but the present disclosure is not limited to this embodiment.

Please refer to FIG. 1 and FIG. 4D, in one embodiment, the voltage clamp circuit 134 includes a second diode D12. For example, when a current flows through the second diode D12 from the gate terminal G to the source terminal S, a voltage across the second diode D12 is defined as a fourth forward voltage VFD12, but the present disclosure is not limited to this embodiment.

In addition, the voltage clamp circuit 134 further includes a plurality of second diodes D12. For example, the plurality of second diodes D12 can be coupled in series to increase a clamp voltage across the gate terminal G and the source terminal S, but the present disclosure is not limited to this embodiment.

Please refer to FIG. 1 and FIG. 4E, in one embodiment, the voltage clamp circuit 135 includes the first Zener diode Z11 and the second Zener diode Z12. For example, when a current flows through the first Zener diode Z11 and the second Zener diode Z12 from the gate terminal G to the source terminal S, a clamp voltage across the gate terminal G and the source terminal S is a sum of the first reverse breakdown voltage VZ11 and the second forward voltage VFZ12. Otherwise, when a current flows through the second Zener diode Z12 and the first Zener diode Z11 from the source terminal S to the gate terminal G, a clamp voltage across the gate terminal G and the source terminal S is a sum of the second reverse breakdown voltage VZ12 and the first forward voltage VFZ11, but the present disclosure is not limited to this embodiment.

Please refer to FIG. 1 and FIG. 4F, in one embodiment, the voltage clamp circuit 136 includes the first diode D11 and the second diode D12. For example, when a current flows through the second diode D12 from the gate terminal G to the source terminal S, a clamp voltage across the gate terminal G and the source terminal S is the fourth forward voltage VFD12. Otherwise, when a current flows through the first diode D11 from the source terminal S to the gate terminal G, a clamp voltage across the gate terminal G and the source terminal S is the third forward voltage VFD11, but the present disclosure is not limited to this embodiment.

In addition, the voltage clamp circuit 136 further includes the plurality of first diodes D11 and the plurality of second diodes D12. For example, the plurality of first diodes D11 can be coupled in series to increase a clamp voltage across the gate terminal G and the source terminal S. Similarly, the plurality of second diodes D12 can be coupled in series to increase the clamp voltage across the gate terminal G and the source terminal S, but the present disclosure is not limited to this embodiment.

Please refer to FIG. 1 and FIG. 4G, in one embodiment, the voltage clamp circuit 137 includes the first Zener diode Z11 and the second diode D12. For example, when a current flows through the second diode D12 and the first Zener diode Z11 from the gate terminal G to the source terminal S, a clamp voltage across the gate terminal G and the source terminal S is a sum of the fourth forward voltage VFD12 and the first reverse breakdown voltage VZ11, but the present disclosure is not limited to this embodiment.

Please refer to FIG. 1 and FIG. 4H, in one embodiment, the voltage clamp circuit 138 includes the first diode D11 and the second Zener diode Z12. For example, when a current flows through the first diode D11 and second Zener diode Z12 from the source terminal S to the gate terminal G, a clamp voltage across the gate terminal G and the source terminal S is a sum of third forward voltage VFD11 and the second reverse breakdown voltage VZ12, but the present disclosure is not limited to this embodiment.

Figure 5:
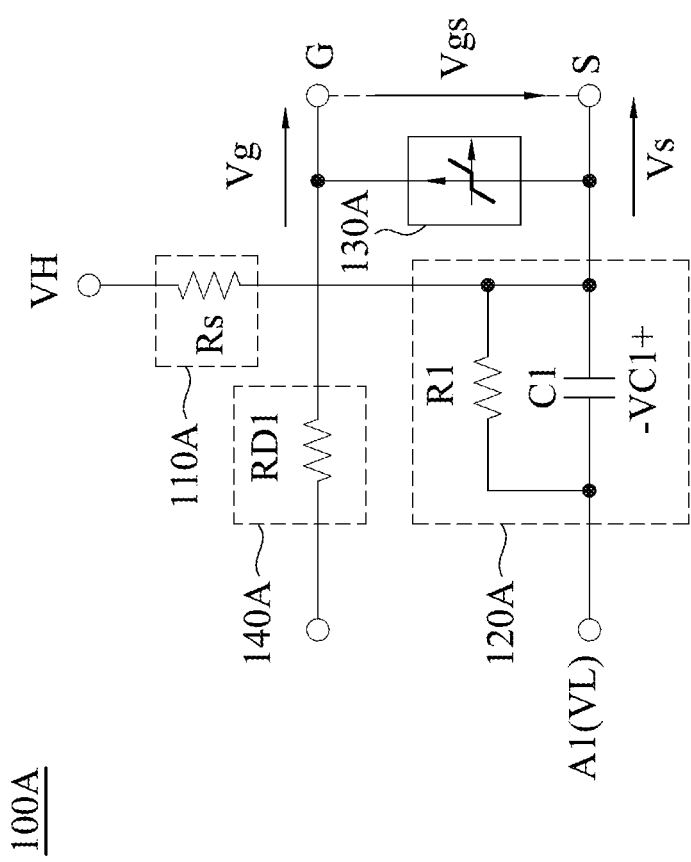
FIG. 5 is a block diagram of a conversion circuit according to one embodiment of the present disclosure.

FIG. 5 is a block diagram of a conversion circuit according to one embodiment of the present disclosure. As shown in figure, compared with the conversion circuit 100 in FIG. 1, the conversion circuit 100A in FIG. 5 further includes a damping circuit 140A, and the damping circuit 140A is coupled to the gate terminal G. In one embodiment, the damping circuit 140A is configured to control a driving speed of the gate-source voltage Vgs. The connections and the operations of other elements in the conversion circuit 100A are similar to that of the elements in the conversion circuit 100 in FIG. 1, and the descriptions regarding the connections and the operations of other elements in the conversion circuit 100A will be omitted herein for the sake of brevity.

FIG. 6A~6D are schematic diagrams of a plurality of elements of a damping circuit according to some embodiments of the present disclosure. Please refer to FIG. 5 first, in one embodiment, the damping circuit 140A includes at least one of a resistor and a diode. For example, the damping circuit 140A includes the resistor, the diode, or the resistor and the diode, but the present disclosure is not limited to this embodiment. In some embodiments, the damping circuit 140A shown in FIG. 5 can be implemented by different types of the damping circuits 141A~144A as illustrated in FIGS. 6A~6D, which will be described below.

Figure 6A:
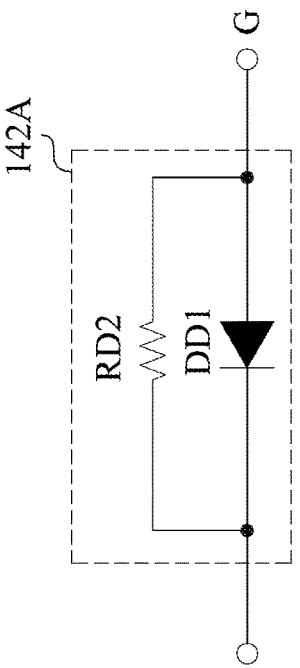
FIG. 6A~6D are schematic diagrams of a plurality of elements of a damping circuit according to some embodiments of the present disclosure.

Please refer to FIG. 5 and FIG. 6A, in one embodiment, the damping circuit 141A includes a first resistor RD1. For example, the damping circuit 141A can be the first resistor RD1, but the present disclosure is not limited to this embodiment.

Figure 6B:
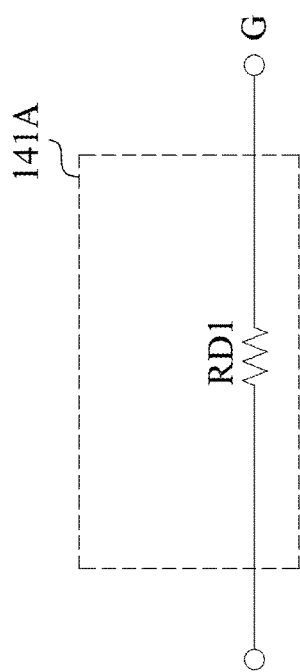

Please refer to FIG. 5 and FIG. 6B, in one embodiment, the damping circuit 142A includes a second resistor RD2 and a third diode DD1. For example, the second resistor RD2 can be coupled to the third diode DD1 in parallel, but the present disclosure is not limited to this embodiment.

Figure 6C:
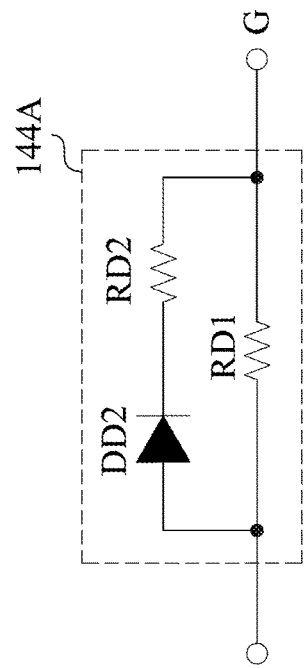

Please refer to FIG. 5 and FIG. 6C, in one embodiment, the damping circuit 143A includes the first resistor RD1, the second resistor RD2, and the third diode DD1. For example, the third diode DD1 can be coupled to the first resistor RD1 in series, and the second resistor RD2 can be coupled to the first resistor RD1 and the third diode DD1 in parallel, but the present disclosure is not limited to this embodiment.

Figure 6D:
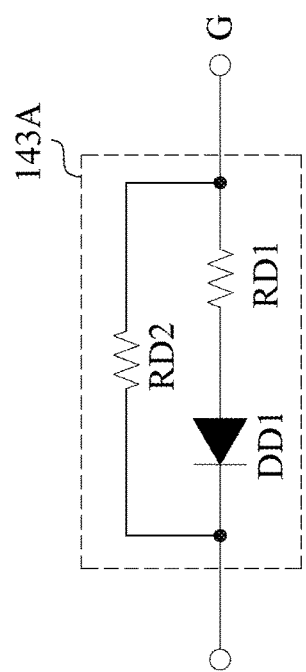

Please refer to FIG. 5 and FIG. 6D, in one embodiment, the damping circuit 144A includes the first resistor RD1, the second resistor RD2, and a fourth diode DD2. For example, the fourth diode DD2 can be coupled to the second resistor RD2 in series, and the first resistor RD1 can be coupled to the second resistor RD2 and the fourth diode DD2 in parallel, but the present disclosure is not limited to this embodiment.

Figure 7:
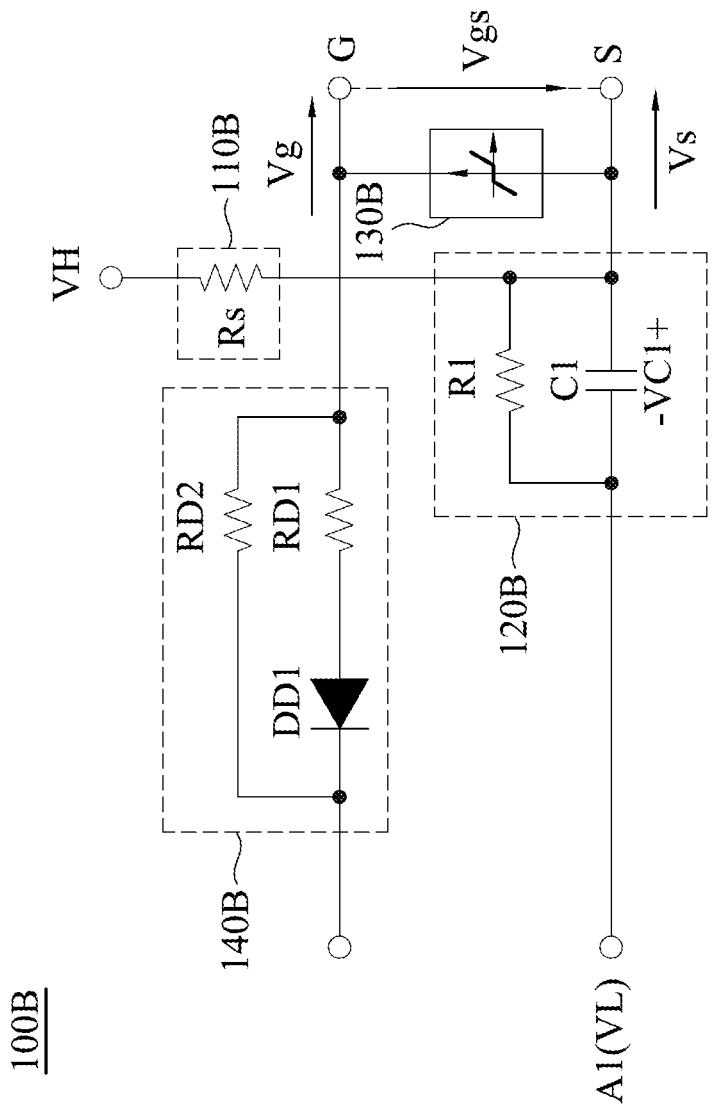
FIG. 7 is a block diagram of a conversion circuit according to one embodiment of the present disclosure.

FIG. 7 is a block diagram of a conversion circuit according to one embodiment of the present disclosure. As shown in figure, compared with the conversion circuit 100 in FIG. 1, the conversion circuit 100B in FIG. 7 further includes a damping circuit 140B, and the damping circuit 140B is coupled to the gate terminal G. In one embodiment, the damping circuit 140B is configured to control a driving speed of the gate-source voltage Vgs. The connections and the operations of other elements in the conversion circuit 100B are similar to that of the elements in the conversion circuit 100 in FIG. 1, and the descriptions regarding the connections and the operations of other elements in the conversion circuit 100B will be omitted herein for the sake of brevity.

In one embodiment, the damping circuit 140B includes the first resistor RD1, the second resistor RD2, and the third diode DD1.

Figure 8:
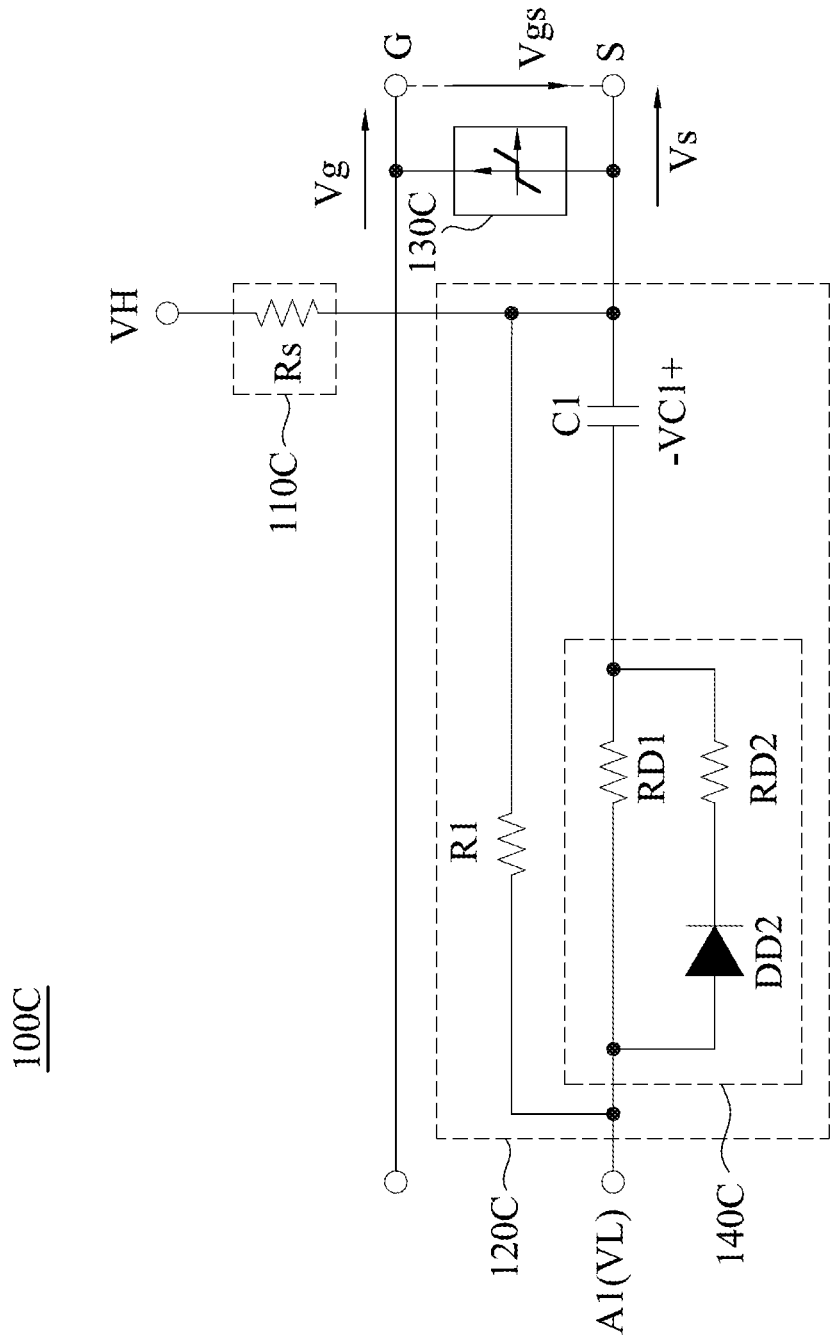
FIG. 8 is a block diagram of a conversion circuit according to one embodiment of the present disclosure.

FIG. 8 is a block diagram of a conversion circuit according to one embodiment of the present disclosure. As shown in figure, compared with the conversion circuit 100 in FIG. 1, the storage circuit 120C of the conversion circuit 100C in FIG. 8 includes a damping circuit 140C, and the damping circuit 140C is coupled to the storage resistor R1 and the storage capacitor C1. In one embodiment, the damping circuit 140C is configured to control a driving speed of the gate-source voltage Vgs. The connections and the operations of other elements in the conversion circuit 100C are similar to that of the elements in the conversion circuit 100 in FIG. 1, and the descriptions regarding the connections and the operations of other elements in the conversion circuit 100C will be omitted herein for the sake of brevity. Please refer to FIG. 1, in one embodiment, the storage circuit 120 further includes a damping circuit (not shown), and the damping circuit is configured to control a driving speed of the gate voltage Vg. In some embodiments, the damping circuit 140C can be coupled to the first terminal A1, the storage resistor R1, and the storage capacitor C1.

Figure 9:
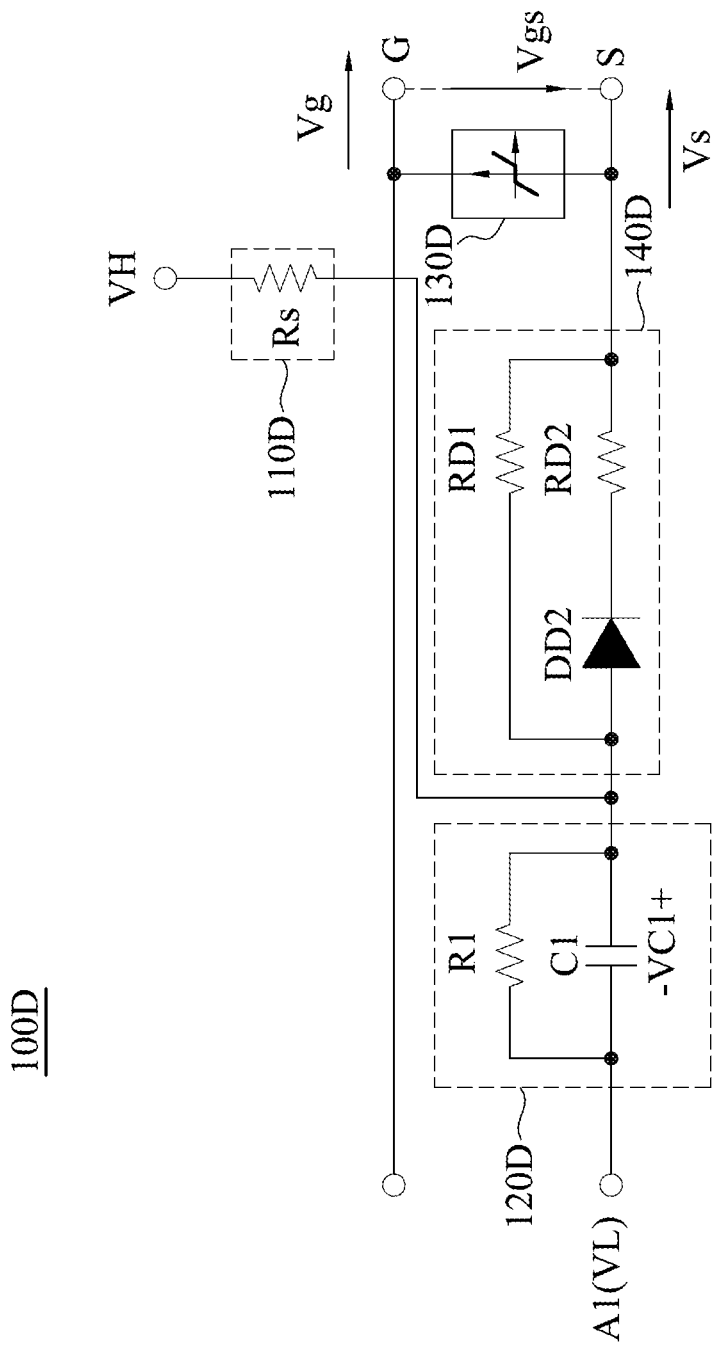
FIG. 9 is a block diagram of a conversion circuit according to one embodiment of the present disclosure.

FIG. 9 is a block diagram of a conversion circuit according to one embodiment of the present disclosure. As shown in figure, compared with the conversion circuit 100 in FIG. 1, the conversion circuit 100D in FIG. 9 further includes a damping circuit 140D, and the damping circuit 140D is coupled between the storage circuit 120D and the source terminal S. In one embodiment, the damping circuit 140D is configured to control a driving speed of the gate-source voltage Vgs. The connections and the operations of other elements in the conversion circuit 100D are similar to that of the elements in the conversion circuit 100 in FIG. 1, and the descriptions regarding the connections and the operations of other elements in the conversion circuit 100D will be omitted herein for the sake of brevity.

Figure 10:
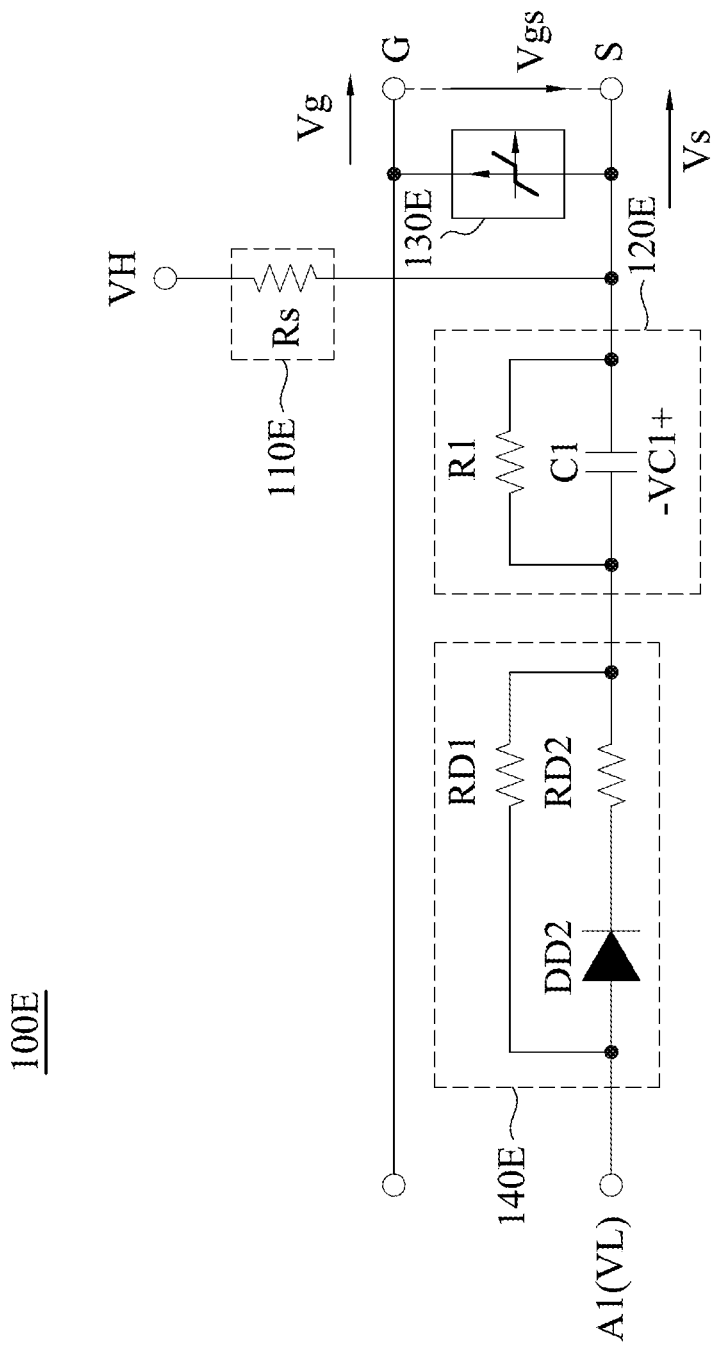
FIG. 10 is a block diagram of a conversion circuit according to one embodiment of the present disclosure.

FIG. 10 is a block diagram of a conversion circuit according to one embodiment of the present disclosure. As shown in figure, compared with the conversion circuit 100 in FIG. 1, the conversion circuit 100E in FIG. 10 further includes a damping circuit 140E, and the damping circuit 140E is coupled between the storage circuit 120E and the first terminal A1. In one embodiment, the damping circuit 140E is configured to control a driving speed of the gate-source voltage Vgs. The connections and the operations of other elements in the conversion circuit 100E are similar to the conversion circuit 100 in FIG. 1, and the descriptions regarding the connections and the operations of other elements in the conversion circuit 100E will be omitted herein for the sake of brevity.

In some embodiments, the damping circuits 140B~140E in FIG. 7~FIG. 10 can be implemented by different types of the damping circuits 141A~144A as illustrated in FIGS. 6A~6D.

Figure 11:
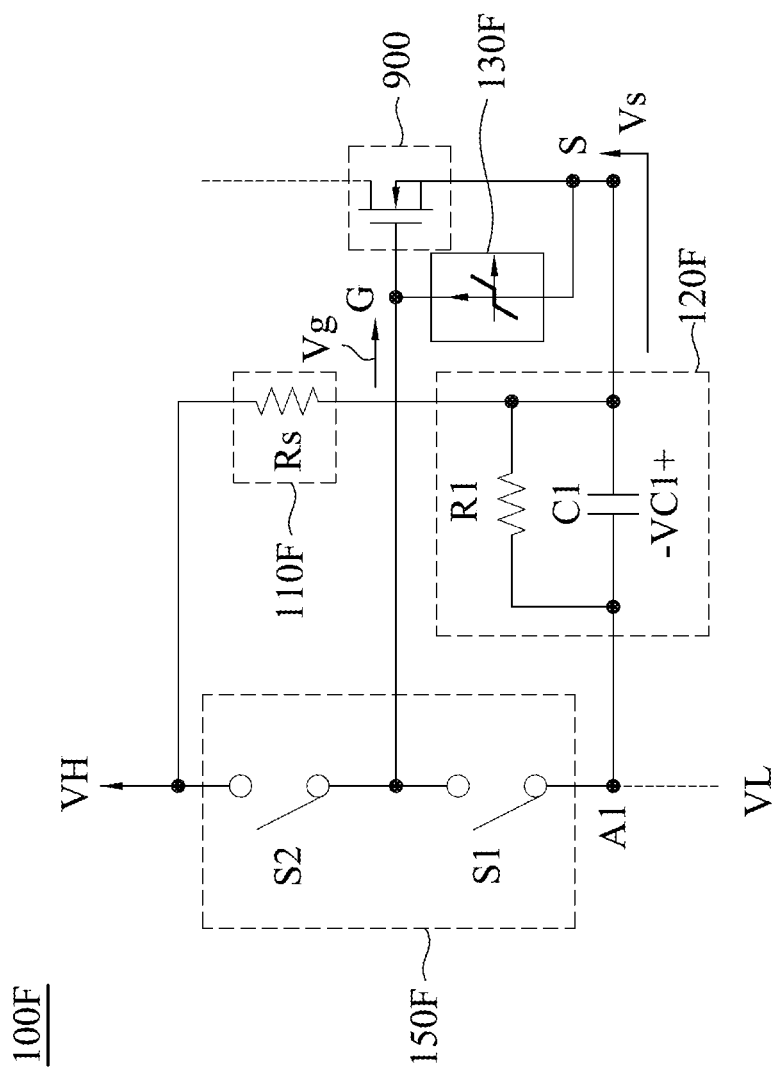
FIG. 11 is a block diagram of a conversion circuit according to one embodiment of the present disclosure.

FIG. 11 is a block diagram of a conversion circuit according to one embodiment of the present disclosure. As shown in the figure, compared with the conversion circuit 100 in FIG. 1, the conversion circuit 100F in FIG. 11 further includes a control circuit 150F, and the control circuit 150F is couple to the storage circuit 120F. In some embodiments, the control circuit 150F can be couple to the storage circuit 120F and the gate terminal G, and the control circuit 150F can receive the power supply voltage VH, but the present disclosure is not limited to this embodiment.

In order to provide a conversion circuit technology that outputs a negative voltage at the initial stage and adjusts the voltage range through the clamp circuit, so as to achieve the gate-source voltage control of the main device, the present disclosure provides the conversion circuit 100F as shown in FIG. 11, and the related operations are described in detail as below.

Please refer to FIG. 2 and FIG. 11, in one embodiment, the voltage supply circuit 110F is configured to provide a bias voltage according to a power supply voltage VH. For example, the voltage supply circuit 110F can be a voltage supply resistor Rs, the power supply voltage VH can be a positive voltage which comes from a power supply device (not shown), and the bias voltage can be generated according to the voltage supply resistor Rs and the power supply voltage VH, but the present disclosure is not limited to this embodiment.

The first terminal A1 is configured to receive the low voltage VL. The source terminal S is configured to output the source voltage Vs according to a storage voltage and the low voltage VL. The storage circuit 120F is configured to storage the storage voltage according to the bias voltage and the low voltage VL. For example, the source terminal S can be coupled to a source terminal of a main device 900, and the low voltage VL can be 0 (e.g., grounded) or the negative voltage, the storage circuit 120F can include the storage resistor R1 and the storage capacitor C1, and the storage voltage can be VC1 which is generated according to the voltage supply resistor Rs, the power supply voltage VH, and the storage resistor R1, but the present disclosure is not limited to this embodiment. In some embodiments, the low voltage VL can be a positive voltage which is smaller than the power supply voltage VH.

In some embodiments, the storage resistor R1 can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

In some embodiments, the storage capacitor C1 can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

In some embodiments, the voltage supply resistor Rs can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

Please refer to FIG. 2 and FIG. 11, the control circuit 150F is used to receive the power supply voltage VH and the low voltage VL. The gate terminal G is configured to output the gate voltage Vg, and the gate-source voltage Vgs is the voltage across the gate terminal G and the source terminal S. During a first period T11, the second switch S2 of control circuit 150F is turn-off and the first switch S1 of control circuit 150F is turn-on, the control circuit 150F receives and transmits the low voltage VL to the gate terminal G, and the gate-source voltage Vgs can form the negative voltage. For example, the control circuit 150F can include a first switch S1. In some embodiments, the first switch S1 of the control circuit 150F is turned on, the gate terminal G can be coupled to a gate terminal of the main device 900, and the gate voltage Vg outputted by the gate terminal G can come from the low voltage VL. The source voltage Vs outputted by the source terminal S can come from the storage voltage VC1, and the gate-source voltage Vgs can be the voltage across the gate terminal G and the source terminal S of the storage circuit 120F. The gate-source voltage Vgs can be −V1 (shown in FIG. 2), and −V1 can be −VC1 when the low voltage VL is 0. In some embodiments, the gate-source voltage Vgs can be −4V, but the present disclosure is not limited to this embodiment.

In addition, there will be noise from the main device or the external environment and the noise will interfere with the conversion circuit 100F. Even if the gate voltage Vg from the gate terminal G has the above-mentioned noise, the conversion circuit 100F is capable of providing the gate voltage Vg being negative so as to neutralize the above-mentioned noise. For example, a value of the gate voltage Vg being negative (e.g., −4V) is set to be larger than a value of the noise being positive (e.g., 1V); and therefore, the gate voltage Vg being negative (e.g., −4V) is able to neutralize the noise being positive (e.g., 1V), such that the gate voltage Vg will be always in a negative way. Subsequently, when the gate terminal of the main device 900 receives the gate voltage Vg being negative, the main device 900 can be turned on or turn off precisely, such that the effect of the false start caused by the noise signal is prevented. That is, as long as the sum of the voltages received by the gate to source terminal of the main device 900 is negative, the main device 900 will not be accidentally turned on or turn off due to the influence of the noise.

In one embodiment, during a second period T21, the second switch S2 of control circuit 150F is turn-on and the first switch S1 of control circuit 150F is turn-off, the control circuit 150F receives and transmits the power supply voltage VH to the gate terminal G, and the gate-source voltage Vgs can form the positive voltage. For example, the gate voltage Vg can be the power supply voltage VH, the source voltage Vs can be the storage voltage VC1 when the low voltage VL is 0. The control circuit 150F can include a second switch S2, so that the control circuit 150F is turned on can be the second switch S2 is turned on, the gate-source voltage Vgs can be the power supply voltage VH minus the storage voltage VC1, and the gate-source voltage Vgs can be V2 (shown in FIG. 2). In some embodiments, the gate-source voltage Vgs can be 5V or higher positive voltage level, but the present disclosure is not limited to this embodiment.

In one embodiment, during a third period T31, the second switch S2 of control circuit 150F is turn-off and the first switch S1 of control circuit 150F is turn-on, the control circuit 150F receives and transmits the low voltage VL to the gate terminal G, and the gate-source voltage Vgs can form a negative voltage (e.g. −4V). Subsequently, during a fourth period T41, the second switch S2 of control circuit 150F is turn-on and the first switch S1 of control circuit 150F is turn-off, the control circuit 150F receives and transmits the power supply voltage VH to the gate terminal G, and the gate-source voltage Vgs can form a positive voltage (e.g., 5V).

Please refer to FIG. 3 and FIG. 11, in one embodiment, the gate terminal G is configured to output a gate voltage Vg, and the gate-source voltage Vgs is the voltage across the gate terminal and the source terminal. During a first period T12, the second switch S2 of control circuit 150F is turn-off and the first switch S1 of control circuit 150F is turn-on, the control circuit 150F receives and transmits the low voltage VL to the gate terminal G, and the gate-source voltage Vgs can form a negative voltage. For example, the control circuit 150F can include the first switch S1, so that the control circuit 150F is turned on can be the first switch S1 is turned on, the cross voltage V can be the voltage across the gate terminal G and the source terminal S of the storage circuit 120F, the gate-source voltage Vgs can be the voltage V across the gate terminal G and the source terminal S of the storage circuit 120F. In some embodiments, the high voltage VHS can be a positive voltage or the power supply voltage VH, and the gate-source voltage Vgs is smaller than the power supply voltage VH, but the present disclosure is not limited to this embodiment.

In some embodiments, the threshold voltage of the GaN transistors is smaller than that of general transistors. In order to prevent the problem of turn-on failure of the GaN transistor, the best design is to use the voltage with 0V or the negative voltage which is less 0V to turn off the GaN transistor. During the first period T12, the gate terminal G is coupled to the first terminal A1 of the storage circuit 120F, and the gate-source voltage Vgs can form the negative voltage. The conversion circuit 100F can provide the gate-source voltage Vgs to successfully turn off of GaN transistor, but the present disclosure is not limited to this embodiment.

In one embodiment, during a second period T22, the second switch S2 of control circuit 150F is turn-on and the first switch S1 of control circuit 150F is turn-off, the control circuit 150F receives and transmits the power supply voltage VH to the gate terminal G, and the gate-source voltage Vgs can form a positive voltage. For example, the control circuit 150F can include the second switch S2, so that the control circuit 150F is turned on can be the second switch S2 is turned on, the gate-source voltage Vgs can be an overcharge positive voltage VPO. Subsequently, the overcharge positive voltage VPO decreases to a stable voltage VP, and the gate-source voltage Vgs is accordingly reduced to the stable voltage VP, but the present disclosure is not limited to this embodiment.

In one embodiment, during a third period T32, the second switch S2 of control circuit 150F is turn-off and the first switch S1 of control circuit 150F is turn-on, the control circuit 150F receives and transmits the low voltage VL to the gate terminal G, and the gate-source voltage Vgs can form a negative voltage. For example, the control circuit 150F can include the first switch S1, so that the control circuit 150F is turned on can be the first switch S1 is turned on, the gate-source voltage Vgs can be an overcharge negative voltage VNO.

Subsequently, the overcharge negative voltage VNO increases to a stable voltage VN, and the gate-source voltage Vgs is accordingly raised to the stable voltage VN, but the present disclosure is not limited to this embodiment.

In one embodiment, during a fourth period T42, the second switch S2 of control circuit 150F is turn-on and the first switch S1 of control circuit 150F is turn-off, the control circuit 150F receives and transmits the power supply voltage VH to the gate terminal G, and the gate-source voltage Vgs can form a positive voltage. For example, the control circuit 150F can include the second switch S2, so that the control circuit 150F is turned on can be the second switch S2 is turned on, the gate-source voltage Vgs can be an overcharge positive voltage VPO. Subsequently, the overcharge positive voltage VPO decreases to a stable voltage VP, and the gate-source voltage Vgs is accordingly reduced to the stable voltage VP, but the present disclosure is not limited to this embodiment.

In one embodiment, the main device 900 can be a physical switch. In some embodiments, the main device 900 can be made of gallium nitride (such as GaN with Gate Injection Transistor, Gate with Ohmic Contact GaN, and Gate with Schottky Contact GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

In some embodiments, the present disclosure relates to the conversion circuit (or a drive circuit) for a power semiconductor switching device and a semiconductor driver circuit of a normally on/off switching device, a transistor, and a semiconductor device using the same. A semiconductor element, which employs a material such as silicon (Si), silicon carbide (SiC), gallium nitride (GaN), gallium arsenide (GaAs), compound semiconductor or diamond, exhibits excellent characteristics as a switching element. Here, examples of such the semiconductor element are as follows: Metal-Oxide-Semiconductor Field-Effect (MOSFET), Junction FET (JFET), Static Induction Transistor (SIT), Metal-Semiconductor Field Effect Transistor (MESFET), Heterojunction Field Effect Transistor (HFET), metal insulator semiconductor field effect transistor (MISFET), High Electron Mobility Transistor (HEMT), and Gate Injection Transistor (GIT), but the present disclosure is not limited to this embodiment.

Please refer to FIG. 11 first, in one embodiment, the conversion circuit 100F further includes a voltage clamp circuit 130F. The voltage clamp circuit 130F coupled between the gate terminal G and the source terminal S, and configured to clamp the gate-source voltage Vgs. In some embodiments, the voltage clamp circuit 130F shown in FIG. 11 can be implemented by different types of the voltage clamp circuits 131~138 as illustrated in FIGS. 4A~4H, which will be described below.

In one embodiment, the voltage clamp circuit 130F includes at least one of a first type diode and a second type diode. For example, the voltage clamp circuit 130F includes the first type diode, the second type diode, or the first type diode and the second type diode, the first type diode can be a normal diode, and the second type diode can be Zener diode, but the present disclosure is not limited to this embodiment. In addition, the voltage clamp circuit 130F is configured to adjust the gate-source voltage range of the conversion circuit 100F. In some embodiments, the voltage clamp circuit 130F can include at least one of the first type diode and a second type zener diode, the first type diode can be the normal diode, and the second type zener diode can be the Zener diode, but the present disclosure is not limited to this embodiment.

In some embodiments, the voltage clamp circuit 130F can be implemented by different types of the voltage clamp circuits 131~138 as illustrated in FIG. 4A~4H.

In some embodiments, the voltage clamp circuit 130F can be made of gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

Figure 12:
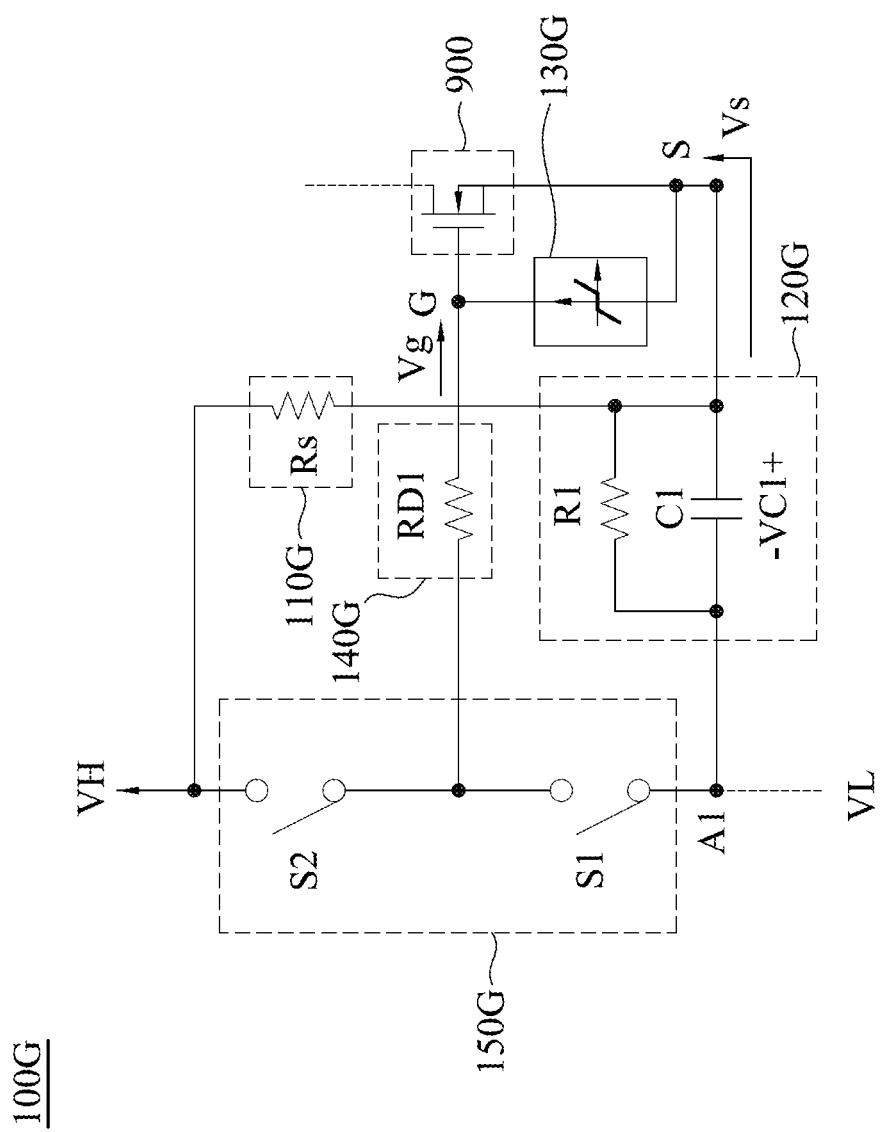
FIG. 12 is a block diagram of a conversion circuit according to one embodiment of the present disclosure.

FIG. 12 is a block diagram of a conversion circuit according to one embodiment of the present disclosure. Please refer to FIG. 12, compared with the conversion circuit 100F in FIG. 11, the conversion circuit 100G in FIG. 12 further includes a damping circuit 140G, and the damping circuit 140G is coupled to the gate terminal G. In one embodiment, the damping circuit 140G is configured to control the driving speed of the gate-source voltage Vgs. The connections and the operations of other elements in the conversion circuit 100G are similar to that of the elements in the conversion circuit 100F in FIG. 11, and the descriptions regarding the connections and the operations of other elements in the conversion circuit 100G will be omitted herein for the sake of brevity.

In one embodiment, the damping circuit 140G includes at least one of a resistor and a diode. For example, the damping circuit 140G can be the resistor, the diode, or the resistor and the diode, but the present disclosure is not limited to this embodiment.

In some embodiment, the damping circuit 140G can be implemented by different types of the damping circuits 141A~144A as illustrated in FIG. 6A~6D.

Figure 13:
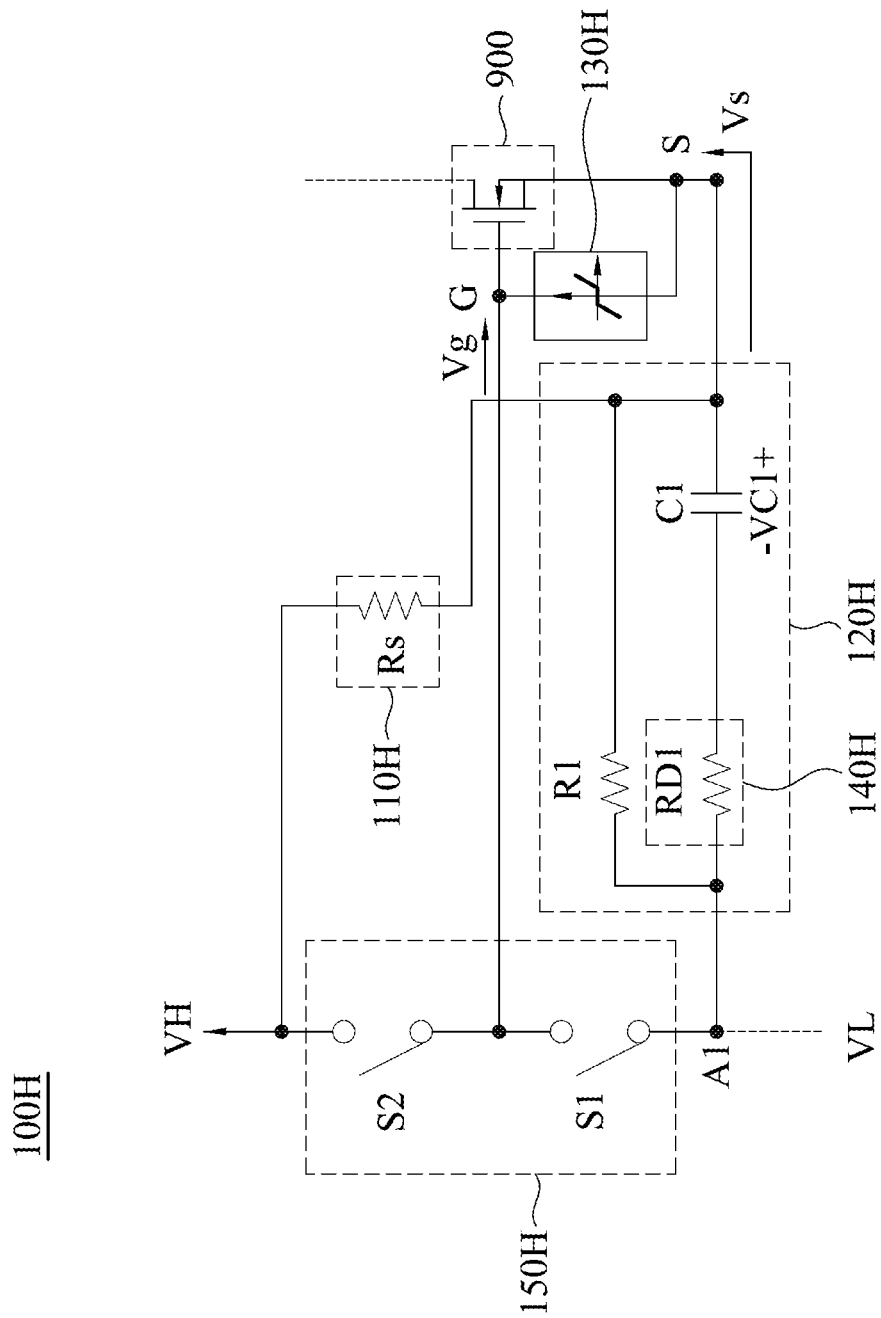
FIG. 13 is a block diagram of a conversion circuit according to one embodiment of the present disclosure.

FIG. 13 is a block diagram of a conversion circuit according to one embodiment of the present disclosure. Please refer FIG. 13, compared with the conversion circuit 100F in FIG. 11, the storage circuit 120H of the conversion circuit 100H in FIG. 13 includes a damping circuit 140H, and the damping circuit 140H is coupled to the storage resistor R1 and the storage capacitor C1. In one embodiment, the damping circuit 140H is configured to control a driving speed of the gate-source voltage Vgs. The connections and the operations of other elements in the conversion circuit 100H are similar to that of the elements in the conversion circuit 100F in FIG. 11, and the descriptions regarding the connections and the operations of other elements in the conversion circuit 100H will be omitted herein for the sake of brevity.

Figure 14:
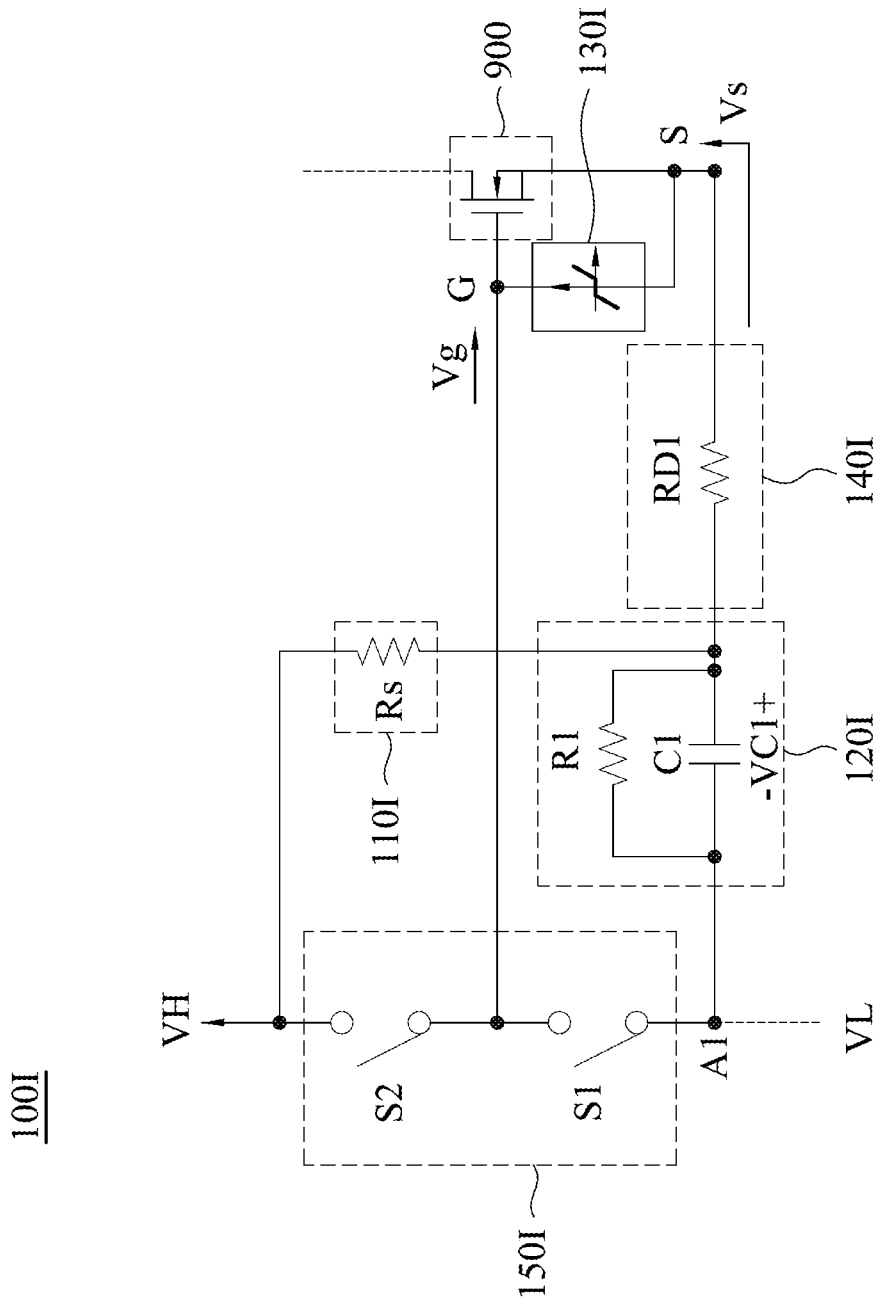
FIG. 14 is a block diagram of a conversion circuit according to one embodiment of the present disclosure.

FIG. 14 is a block diagram of a conversion circuit according to one embodiment of the present disclosure. As shown in figure, compared with the conversion circuit 100F in FIG. 11, the conversion circuit 100I in FIG. 14 further includes a damping circuit 140I, and the damping circuit 140I is coupled to the storage circuit 120I and the source terminal S. In one embodiment, the damping circuit 140I is configured to control a driving speed of the gate-source voltage Vgs. The connections and the operations method of other elements in the conversion circuit 100I are similar to that of the elements in the conversion circuit 100F in FIG. 11, and the descriptions regarding the connections and the operations of other elements in the conversion circuit 100I will be omitted herein for the sake of brevity.

Figure 15:
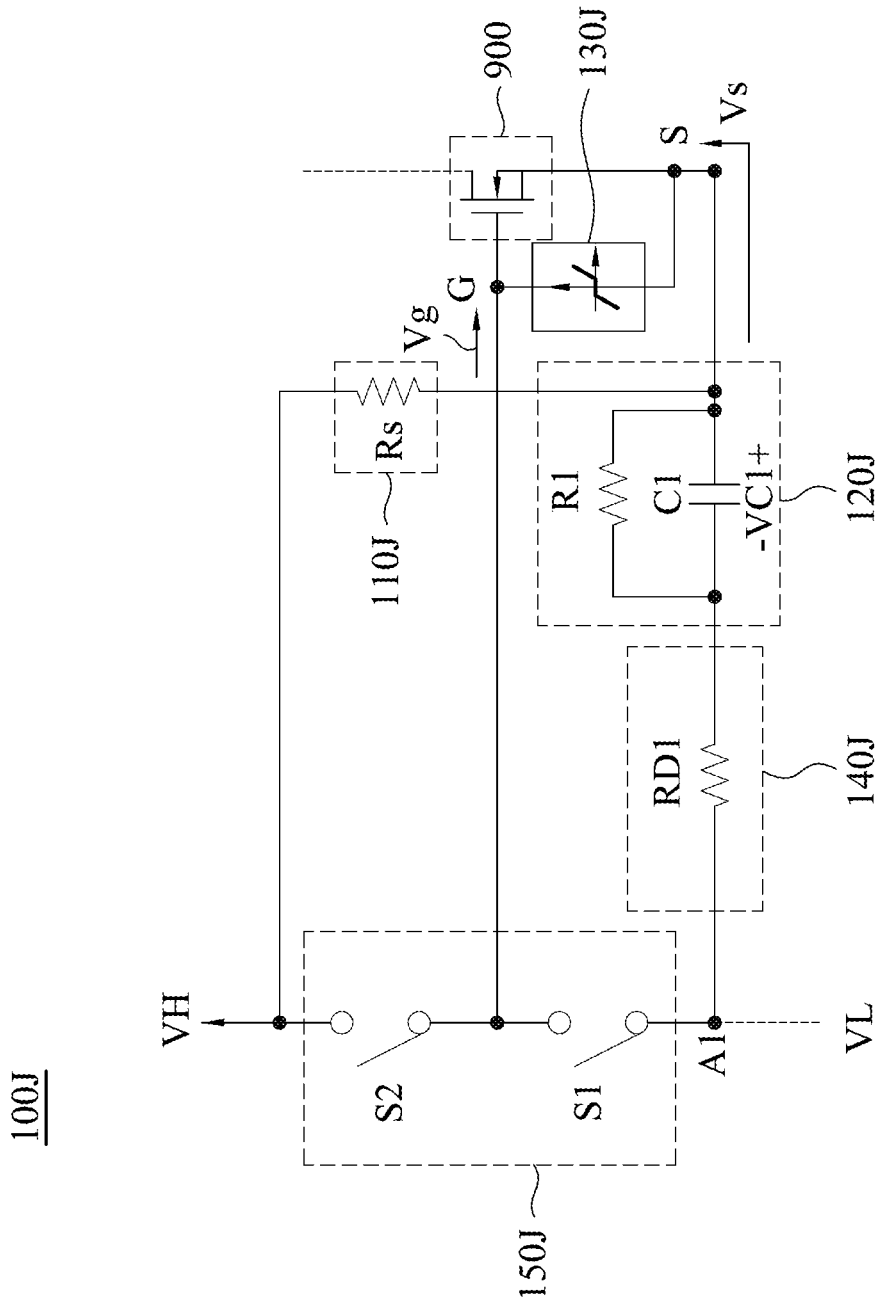
FIG. 15 is a block diagram of a conversion circuit according to one embodiment of the present disclosure.

FIG. 15 is a block diagram of a conversion circuit according to one embodiment of the present disclosure. As shown in figure, compared with the conversion circuit 100F in FIG. 11, the conversion circuit 100J in FIG. 15 includes a damping circuit 140J, and the damping circuit 140J is coupled to the storage circuit 120J and the control circuit 150J. In one embodiment, the damping circuit 140J is configured to control a driving speed of the gate-source voltage Vgs. The connections and the operations of other elements in the conversion circuit 100J are similar to the conversion circuit 100F in FIG. 11, and the descriptions regarding the connections and the operations of other elements in the conversion circuit 100J will be omitted herein for the sake of brevity.

In some embodiments, the damping circuits 140G~140J in FIG. 12~FIG. 15 can be implemented by different types of the damping circuits 141A~144A as illustrated in FIG. 6A~6D.

Figure 16:
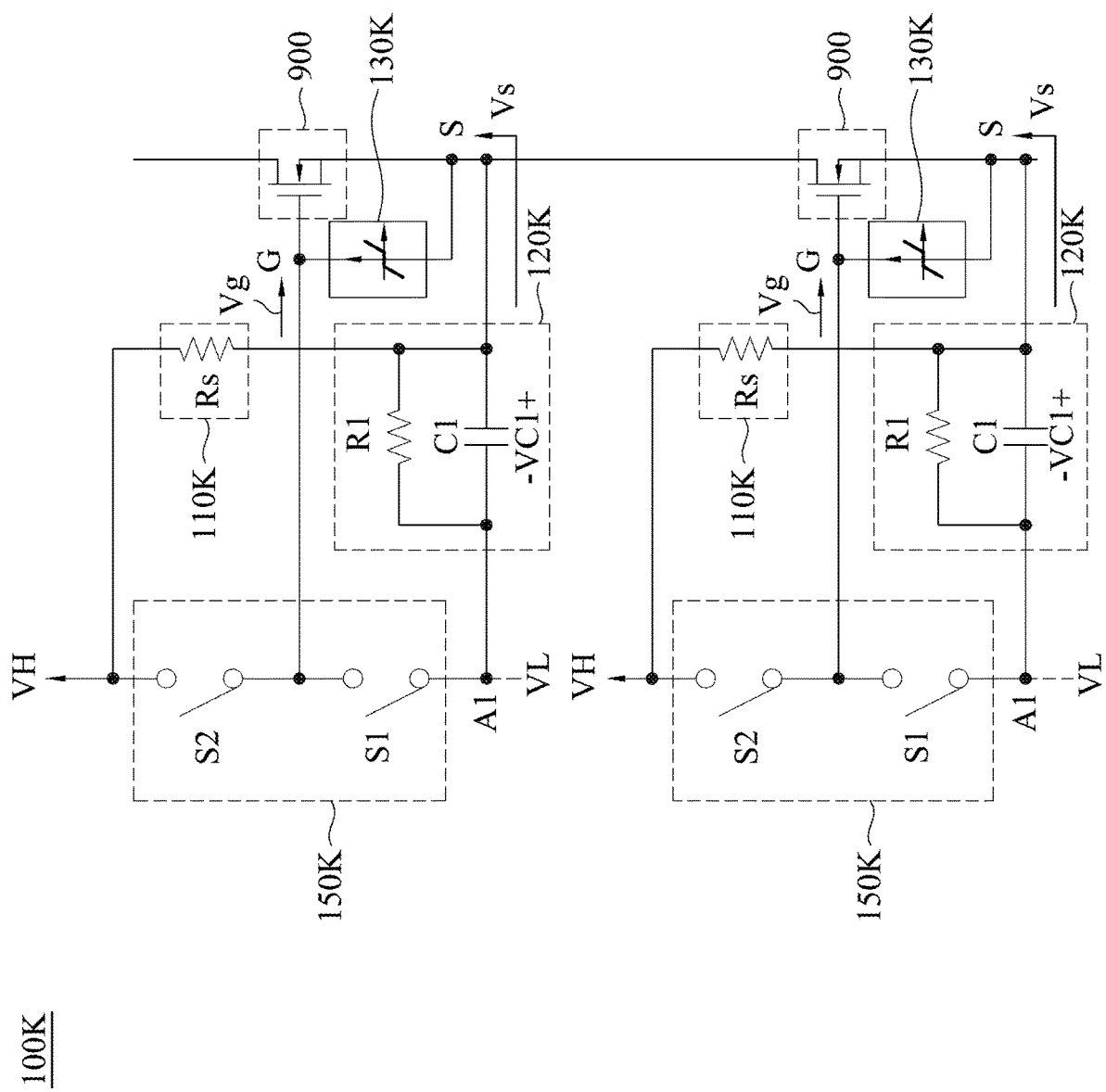
FIG. 16 is a block diagram of a conversion circuit according to one embodiment of the present disclosure.

FIG. 16 is a block diagram of a conversion circuit according to one embodiment of the present disclosure. As shown in the figure, compared with the conversion circuit 100F in FIG. 11, the conversion circuit 100K includes at least two conversion circuits, and the at least two conversion circuits are coupled with each other. The connections and the operations of the elements in the conversion circuit 100K are similar to that of the conversion circuit 100F in FIG. 11, and the descriptions regarding the connections and the operations of the elements in the conversion circuit 100K will be omitted herein for the sake of brevity.

In some embodiments, the voltage clamp circuits 130F~130K in FIG. 11~FIG. 16 can be implemented by different types of the voltage clamp circuits 131~138 as illustrated in FIG. 4A~4H.

In one embodiment, the control circuit 150F~150K includes a plurality of switches S1, S2. In some embodiments, the plurality of switches S1, S2 can be made of the physical switch, gallium nitride (GaN), gallium arsenide (GaAs), silicon (Si), silicon carbide (SiC), Insulated Gate Bipolar Transistor (IGBT) materials, or other semiconductor materials that can form the same function, but the present disclosure is not limited to this embodiment.

In some embodiments, the control circuit 150F~150J, the damping circuit 140F~140J, the storage circuit 120F~120J, the voltage supply circuit 110F~110J, and the voltage clamp circuit 130F~130J can be integrated in any type of packaging method, but the present disclosure is not limited to this embodiment.

In some embodiments, the main device 900, the damping circuit 140F~140J, the storage circuit 120F~120J, the voltage supply circuit 110F~110J, and the voltage clamp circuit 130F~130J can be integrated in any type of packaging method, but the present disclosure is not limited to this embodiment.

In some embodiments, the main device 900 and the voltage clamp circuit 130F~130J can be integrated in any type of packaging method, but the present disclosure is not limited to this embodiment.

In some embodiments, the main device 900, the control circuit 150F~150J, the damping circuit 140F~140J, the storage circuit 120F~120J, the voltage supply circuit 110F~110J, and the voltage clamp circuit 130F~130J can be integrated in any type of packaging method, but the present disclosure is not limited to this embodiment.

It can be seen from the above embodiments of the present disclosure that the application of the present disclosure has the following advantages. The conversion circuit shown in the embodiment of the present disclosure can output the negative voltage at the initial stage and adjust the voltage range through the voltage clamp circuit, so as to achieve the gate-source voltage control of the main device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A conversion circuit, comprising:
 a voltage supply circuit, configured to provide a bias voltage according to a power supply voltage;
 a storage circuit, comprising:
 a first terminal, configured to receive a low voltage; and
 a source terminal, configured to output a source voltage according to a storage voltage and the low voltage, wherein the storage circuit is configured to storage the storage voltage according to the bias voltage and the low voltage; and
 a gate terminal, configured to output a gate voltage, wherein a gate-source voltage is a voltage across the gate terminal and the source terminal, wherein during a first period, the gate terminal is coupled to the first terminal, and the gate-source voltage comprises a negative voltage.

2. The conversion circuit of claim 1, wherein during a second period, the gate terminal receives the power supply voltage, and the gate-source voltage comprises a positive voltage.

3. The conversion circuit of claim 2, further comprising:
 a damping circuit, configured to control a driving speed of the gate-source voltage.

4. The conversion circuit of claim 3, wherein the damping circuit comprises at least one of a resistor and a diode.

5. The conversion circuit of claim 2, wherein the storage circuit further comprises a damping circuit, wherein the damping circuit is configured to control a driving speed of the gate-source voltage.

6. A conversion circuit, comprising:
 a voltage supply circuit, configured to provide a bias voltage according to a power supply voltage;
 a storage circuit, comprising:
 a first terminal, configured to receive a low voltage; and
 a source terminal, configured to output a source voltage according to a storage voltage and the low voltage, wherein the storage circuit is configured to storage the storage voltage according to the bias voltage and the low voltage;
 a gate terminal, configured to output a gate voltage, wherein a gate-source voltage is a voltage across the gate terminal and the source terminal; and
 a voltage clamp circuit, coupled between the gate terminal and the source terminal, and configured to clamp the gate-source voltage;
 wherein during a first period, the gate terminal is coupled to the first terminal, and the gate-source voltage comprises a negative voltage.

7. The conversion circuit of claim 6, wherein during a second period, the gate terminal receives the power supply voltage, and the gate-source voltage comprises a positive voltage.

8. The conversion circuit of claim 7, further comprising:
 a damping circuit, configured to control a driving speed of the gate-source voltage.

9. The conversion circuit of claim 8, wherein the damping circuit comprises at least one of a resistor and a diode.

10. The conversion circuit of claim 6, wherein the storage circuit comprises a damping circuit, wherein the damping circuit is configured to control a driving speed of the gate-source voltage.

11. The conversion circuit of claim 10, wherein the damping circuit comprises at least one of a resistor and a diode.

12. The conversion circuit of claim 7, wherein the voltage clamp circuit comprises at least one of a first type diode and a second type diode.

13. The conversion circuit of claim 12, wherein the first type diode comprises a normal diode, wherein the second type diode comprises a Zener diode.

14. A conversion circuit, comprising:
 a voltage supply circuit, configured to provide a bias voltage according to a power supply voltage;
 a storage circuit, comprising:
 a first terminal, configured to receive a low voltage; and
 a source terminal, configured to output a source voltage according to a storage voltage and the low voltage, wherein the storage circuit is configured to storage the storage voltage according to the bias voltage and the low voltage;
 a control circuit, configured to receive the power supply voltage and the low voltage, and couple to the storage circuit; and
 a gate terminal, coupled to the control circuit, and configured to output a gate voltage, wherein a gate-source voltage is a voltage across the gate terminal and the source terminal, wherein during a first period, a first switch of the control circuit is turn-on, the control circuit receives and transmits the low voltage to the gate terminal, and the gate-source voltage comprises a negative voltage.

15. The conversion circuit of claim 14, wherein during a second period, a second switch of the control circuit is turn-on, the control circuit receives and transmits the power supply voltage to the gate terminal, and the gate-source voltage comprises a positive voltage.

16. The conversion circuit of claim 15, further comprising:
 a voltage clamp circuit, coupled between the gate terminal and the source terminal, and configured to clamp the gate-source voltage.

17. The conversion circuit of claim 16, wherein the voltage clamp circuit comprises at least one of a first type diode and a second type diode.

18. The conversion circuit of claim 15, further comprising:
 a damping circuit, configured to control a driving speed of the gate-source voltage.

19. The conversion circuit of claim 18, wherein the damping circuit comprises at least one of a resistor and a diode.

20. The conversion circuit of claim 15, wherein the storage circuit comprises a damping circuit, wherein the damping circuit is configured to control a driving speed of the gate-source voltage.

21. The conversion circuit of claim 14, further comprising:
 a main device, couple to the gate terminal and the source terminal, and configured to receive the gate-source voltage.

22. The conversion circuit of claim 14, wherein the storage circuit further comprises:
 a storage resistor; and a storage capacitor, configured to storage the storage voltage.

23. The conversion circuit of claim 14, wherein first type diode comprises a normal diode, wherein the second type diode comprises a Zener diode.

\* \* \* \* \*